US009171927B2

(12) United States Patent
Mehta et al.

(10) Patent No.: US 9,171,927 B2
(45) Date of Patent: Oct. 27, 2015

(54) SPACER REPLACEMENT FOR REPLACEMENT METAL GATE SEMICONDUCTOR DEVICES

(71) Applicant: International Business Machines Corporation, Armonk, NY (US)

(72) Inventors: Sanjay C. Mehta, Niskayuna, NY (US); Shom S. Ponoth, Gaithersburg, MD (US); Muthumanickam Sankarapandian, Niskayuna, NY (US); Theodorus E. Standaert, Clifton Park, NY (US); Tenko Yamashita, Schenectady, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/850,470

(22) Filed: Mar. 26, 2013

(65) Prior Publication Data

US 2014/0295637 A1    Oct. 2, 2014

(51) Int. Cl.
| | | |
|---|---|---|
| *H01L 21/336* | (2006.01) | |
| *H01L 21/311* | (2006.01) | |
| *H01L 29/66* | (2006.01) | |
| *H01L 29/49* | (2006.01) | |
| *H01L 29/78* | (2006.01) | |

(52) U.S. Cl.
CPC ...... *H01L 29/66553* (2013.01); *H01L 29/4966* (2013.01); *H01L 29/6653* (2013.01); *H01L 29/66545* (2013.01); *H01L 29/66628* (2013.01); *H01L 29/66795* (2013.01); *H01L 29/785* (2013.01)

(58) Field of Classification Search
CPC .................. H01L 29/66583; H01L 29/6653
USPC ......................................................... 438/300
See application file for complete search history.

(56) References Cited

U.S. PATENT DOCUMENTS

| | | | |
|---|---|---|---|
| 6,107,667 A | 8/2000 | An et al. | |
| 6,184,097 B1 | 2/2001 | Yu | |
| 6,664,156 B1 * | 12/2003 | Ang et al. | 438/229 |

(Continued)

OTHER PUBLICATIONS

Van Meer et al., "The Spacer/Replacer Concept: A Viable Route for Sub-100 nm Ultrathin-Film Fully-Depleted SOI CMOS" IEEE Electron Device Letters, vol. 23, No. 1, Jan. 2002 [online], [retrieved on Aug. 6, 2012]. Retrieved from the Internet <URL: http://ieeexplore.ieee.org/stamp/stamp.jsp?tp=&arnumber=974808>.

*Primary Examiner* — Mary Wilczewski
*Assistant Examiner* — Damian A Hillman
(74) *Attorney, Agent, or Firm* — Yuanmin Cai; Hoffman Warnick LLC

(57) ABSTRACT

A method comprising steps of removing a first dielectric material, including a hard mask layer and one or more spacer material layers, from a semiconductor device having a sacrificial gate whose sidewalls being covered by said spacer material layers, and a raised source and a raised drain region with both, together with said sacrificial gate, being covered by said hard mask layer, wherein the removing is selective to the sacrificial gate, raised source region and raised drain region and creates a void between each of the raised source region, raised drain region and sacrificial gate. The method includes depositing a conformal layer of a second dielectric material to the semiconductor device, wherein the second material conforms in a uniform layer to the raised source region, raised drain region and sacrificial gate, and fills the void between each of the raised source region, raised drain region and sacrificial gate.

9 Claims, 3 Drawing Sheets

(56) References Cited

U.S. PATENT DOCUMENTS

| | | |
|---|---|---|
| 6,677,646 B2 | 1/2004 | Ieong et al. |
| 7,125,805 B2 | 10/2006 | Chen et al. |
| 7,510,923 B2 | 3/2009 | Mehrotra et al. |
| 8,119,508 B2 | 2/2012 | Kavalieros et al. |
| 8,178,400 B2 | 5/2012 | Chang et al. |
| 2003/0025163 A1* | 2/2003 | Kwon .......................... 257/360 |
| 2003/0027414 A1* | 2/2003 | Ko ................. 438/595 |
| 2004/0259303 A1* | 12/2004 | Lee et al. ...................... 438/232 |
| 2006/0115941 A1* | 6/2006 | Shin ............................. 438/197 |
| 2006/0131656 A1* | 6/2006 | Shin et al. ..................... 257/369 |
| 2007/0018254 A1* | 1/2007 | Yoo et al. ...................... 257/382 |
| 2010/0219456 A1 | 9/2010 | Kavalieros et al. |
| 2011/0057267 A1 | 3/2011 | Chuang et al. |
| 2011/0254098 A1 | 10/2011 | Wong et al. |

* cited by examiner

SPACER REPLACEMENT FOR REPLACEMENT METAL GATE SEMICONDUCTOR DEVICES

FIELD OF THE INVENTION

The present invention relates generally to the field of semiconductor devices and semiconductor device fabrication, and more particularly to spacer replacement for replacement metal gate semiconductor devices.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Field-effect transistors (FETs), such as metal-oxide-semiconductor FETs (MOSFETs), are a commonly used semiconductor device. Generally, a FET has three terminals, e.g., a gate structure, a source region, and a drain region. In some instances, the body of the semiconductor may be considered a fourth terminal. The gate structure is a structure used to control output current, e.g., flow of carriers in the channel portion of a FET, through electrical or magnetic fields. The channel portion of the substrate is the region between the source region and the drain region of a semiconductor device that becomes conductive when the semiconductor device is turned on. The source region is a doped region in the semiconductor device from which majority carriers are flowing into the channel portion. The drain region is a doped region in the semiconductor device located at the end of the channel portion, into which carriers are flowing from the source region via the channel portion and out of the semiconductor device through the drain region.

Semiconductor device fabrication is typically a multiple step sequence of photolithographic and chemical processing steps during which electronic circuits are gradually created on a wafer made of semiconducting material. Etching is used to remove layers from the surface of a wafer during manufacturing. Etching, in conjunction with lithographic techniques, is used to attack certain areas of a semiconductor surface in order to form recesses in the material or to otherwise remove portions of semiconductor layers where predominantly vertical sides are desired. For many etching steps, part of the wafer is protected from the etchant by a masking material which resists etching.

Also in semiconductor device fabrication, areas in which a metal gate is to exist are often filled with a sacrificial gate material, such as polysilicon, that is later replaced with the metal gate material. The sacrificial gate, also called a dummy gate, holds the position for the metal gate and is better able to withstand the more severe processing conditions so as to prevent damage to metal gate material that would occur if the metal gate material were in place during certain processing.

Semiconductor fins are often used in advanced semiconductor manufacturing technology because of the increased integration levels they provide. When a transistor such as a FinFET is formed, it provides a gate width that may be larger than the gate width of a conventional transistor formed on the same substrate region because the gate structure extends over the top and sides of the fin, all of which serve as channels.

Spacers are constructed on semiconductor devices to form a mask for source/drain implantation, as well as encapsulate and protect the sidewalls of the gate. Some issues may arise with spacers, such as whether they can stay in place after the material to which they are attached is removed, whether the spacer profile is acceptable, and whether the underlying material is attacked by the etch removing the material attached to the spacer. Some of these issues result in higher topography on one side of the spacer than the other.

SUMMARY

Embodiments of the present invention disclose a method comprising steps of removing a first dielectric material, including a hard mask layer and one or more spacer material layers, from a semiconductor device having a sacrificial gate whose sidewalls being covered by said one or more spacer material layers, and a raised source region and a raised drain region with both, together with said sacrificial gate, being covered by said hard mask layer, wherein the removing of the first dielectric material is selective to the sacrificial gate and to the raised source region and the raised drain region and creates a void between the raised source region and the sacrificial gate and a void between the raised drain region and the sacrificial gate. The method then includes depositing a conformal layer of a second dielectric material to the semiconductor device, wherein the second dielectric material conforms in a uniform layer to the raised source region, the raised drain region and the sacrificial gate, and fills the void between the raised source region and the sacrificial gate, and the void between the raised drain region and the sacrificial gate.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings.

DETAILED DESCRIPTION

Figure 1:
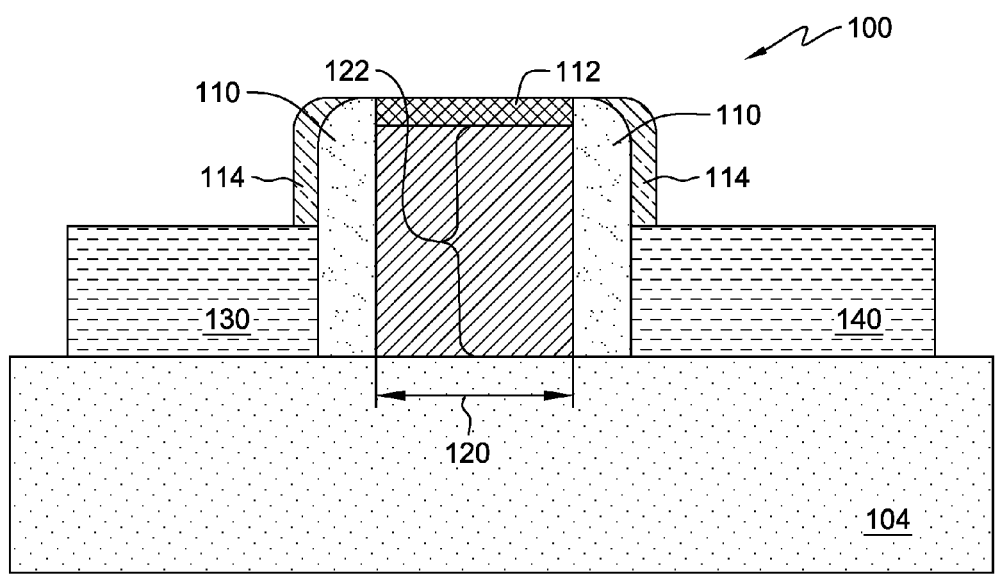
FIG. 1 depicts an exemplary semiconductor device with a sacrificial gate formed over a semiconductor fin, in accordance with an embodiment of the present invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

FIG. 1 depicts an exemplary semiconductor device with a sacrificial gate formed over a semiconductor fin, in accordance with an embodiment of the present invention. Although the present disclosure provides details concerning spacer replacement on a fin field effect transistor (finFET) 100 (the exemplary semiconductor device), the process disclosed herein may provide electrical contact to any device including, but not limited to, memory devices, resistors, diodes, capacitors, and other semiconductor devices, such as, Schottky barrier MOSFETS, and bipolar junction transistors.

FinFET 100 has undergone multiple conventional processing steps to create the structure depicted in FIG. 1, including, for example, the formation of semiconductor fin 104 on and within a semiconductor substrate through the use of known techniques. The semiconductor substrate (not shown) may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate may also be composed of other semiconductor materials, such as germanium, and compound semiconductor substrates, such as type III/V semiconductor substrates, e.g., GaAs. Additionally, semiconductor on insulator (SOI) substrate arrangements, such as silicon on insulator substrates, are also suitable for the semiconductor substrate.

Semiconductor fin 104 has a width which may, in various embodiments of the present invention, vary from about 15 nm to about 50 nm, and a height which may range from about 20 nm to about 40 nm. Sacrificial gate 122, which is deposited over semiconductor fin 104, may be formed of polysilicon or other non-metal materials that are durable and thermally robust but easily removable. One exemplary process for forming sacrificial gate 122 includes depositing a dielectric material layer over semiconductor fin 104 and a polysilicon layer over the dielectric layer. A lithography/gate etch process removes unnecessary portions of the stacked layers to leave sacrificial gate 122, containing a gate dielectric layer (also referred to as the gate oxide) and a polysilicon layer. Sacrificial gate 122 has a width, which serves as the channel region length for channel 120. In various embodiments of the present invention, the width of sacrificial gate 122 may range from about 15-50 nm and the height of sacrificial gate 122 may range from about 75-120 nm. Ultimately, sacrificial gate 122 may be comprised of any material that can be etched selectively to the underlying upper semiconductor substrate layer, such as channel region 120. Various processes for forming sacrificial gates and the order of the steps are known in the art.

Also shown in FIG. 1 is spacer 110, formed by deposition of a conformal dielectric layer on finFET 100, followed by directional etching to remove all of the dielectric material on the horizontal surfaces, leaving only the material on the sidewalls of sacrificial gate 122. Spacer 110 may be in direct contact with the sidewalls of sacrificial gate 122. Spacer 110 typically has a width ranging from 2.0 nm to 15.0 nm, as measured from the sidewall of sacrificial gate 122. Spacer 110 may be composed of a dielectric, such as a nitride, oxide, oxynitride, or a combination thereof. In one embodiment spacer 110 is composed of silicon nitride ($Si_3N_x$). Those skilled in the art will recognize that a "set" of sidewall spacers may actually comprise a single spacer formed around the entire gate. Some issues with spacer formation, including where the etch removes some of the underlying material or not enough of the material attached to the spacer, result in impurities in uniformity of spacer height and width.

Raised source region 130 and raised drain region 140 have been grown and formed according to processes well known in the field. Source region 130 is a doped region of the transistor, from which majority carriers are flowing into channel 120. Drain region 140 is a doped region of the transistor located at the end of channel 120, into which carriers are flowing from source region 130 via channel 120, and out of semiconductor fin 104. Channel 120 is the region between source region 130 and drain region 140 that becomes conductive when finFET 100 is turned on. Source and drain formation includes a number of high-temperature steps (e.g., implants and anneals). The conductivity-type of source region 130 and drain region 140 determines the conductivity of finFET 100. Conductivity-type denotes whether source region 130 and drain region 140 have been doped with a p-type or n-type dopant. N-type dopant in a silicon containing material includes type V elements from the Periodic Table of Elements, such as phosphorus and arsenic. P-type dopant in a silicon containing material includes type III elements from the Periodic Table of Elements, such as boron.

Hard mask 112 can be a silicon nitride material deposited covering sacrificial gate 122, source region 130, drain region 140, and spacer 110. In an exemplary embodiment of the present invention, hard mask 112 can be formed over top of sacrificial gate 122 using conventional etching methods. In various embodiments of the present invention, hard mask 112 may be etched over top of source region 130, drain region 140, and/or spacer 110, in addition to covering sacrificial gate 122. Additional dielectric material, for example, an additional silicon nitride layer, may be deposited on finFET 100, and directionally etched selective to spacer 110, hard mask 112, sacrificial gate 122, source region 130 and drain region 140 to form additional spacers, as shown by spacer 114. In various embodiments of the present invention, each of the dielectric material layers deposited on finFET 100 can be formed through the use of conventional processing steps that can impact the material properties of the layers, for example, doping processes, epitaxial growth processes, implantation processes, patterning or masking processes. Such processing steps may reduce either a capacitance or an inductance of the dielectric material layers.

Although only one semiconductor device (finFET 100) is shown in FIG. 1, any number of semiconductor devices may be formed on the semiconductor substrate in various embodiments. Where multiple devices exist, device regions are preferably separated via dielectric trench isolation (not shown). This prevents electrical current leakage between adjacent semiconductor device components. In various embodiments, isolation regions may be at varying depths to form embodiments of shallow trench isolation or deep trench isolation.

Figure 2:
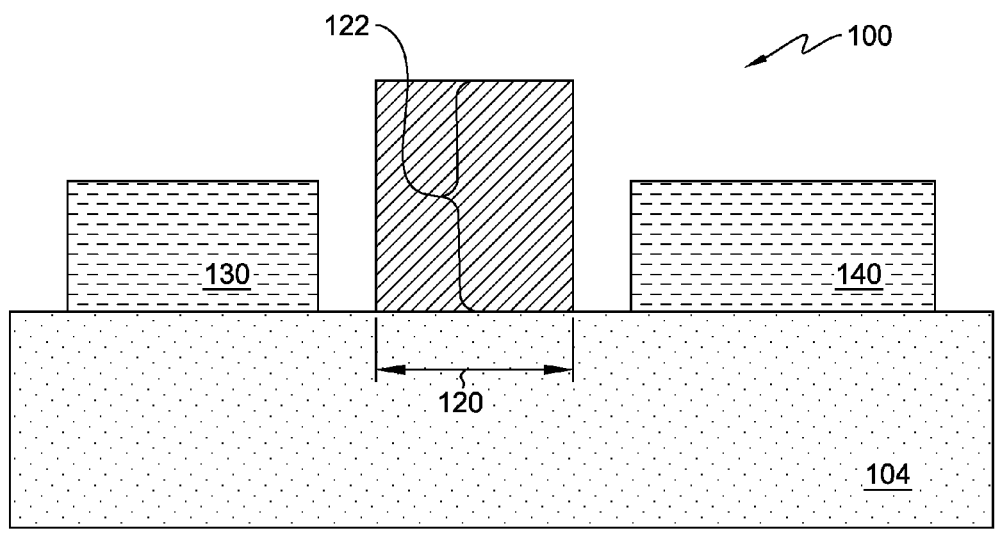
FIG. 2 depicts the semiconductor device of FIG. 1 after removal of dielectric material, in accordance with an embodiment of the present invention.

FIG. 2 depicts the semiconductor device of FIG. 1 after removal of dielectric material, in accordance with an embodiment of the present invention. In an exemplary embodiment, the dielectric material used for spacer 110, hard mask 112 and spacer 114 are silicon nitride. Spacer 110, hard mask 112 and spacer 114 may be removed by selective etching processes, including wet etch operations (e.g., hot phosphoric acid), reactive ion etching (RIE), dry etch operations, or various other etching operations, the etching processes selective to source region 130, drain region 140 and sacrificial gate 122. In an embodiment of the present invention, a silicon cap may be added to prevent significant impacts to source region 130 and drain region 140 of the semiconductor device due to the use of some etching chemicals. Removal of the dielectric material creates a void between sacrificial gate 122 and source region 130 and a void between sacrificial gate 122 and drain region 140 of finFET 100.

Figure 3:
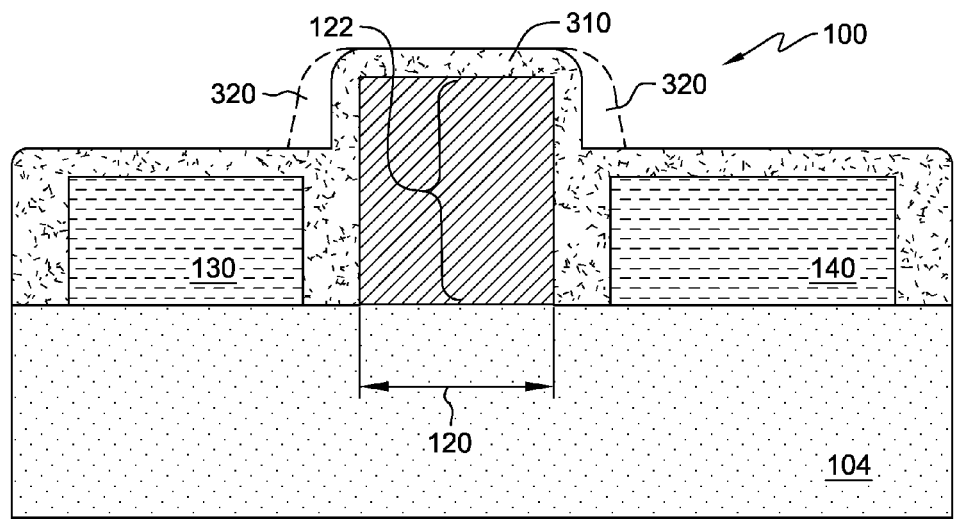
FIG. 3 depicts the semiconductor device of FIG. 1 with deposition of a conformal layer over the structure, in accordance with an embodiment of the present invention.

FIG. 3 depicts finFET 100 with deposition of conformal layer 310 over the structure, in accordance with an embodiment of the present invention. In an exemplary embodiment of the present invention, conformal layer 310 is a uniform layer of a high quality dielectric material, for example, a silicon nitride material, and is formed over the entire surface of the semiconductor structure using a blanket or other deposition operation, such as molecular layer deposition (MLD). In an exemplary embodiment of the present invention, conformal layer 310 is deposited such that it fills the void between sacrificial gate 122 and source region 130 and the void between sacrificial gate 122 and drain region 140. Conformal layer 310 may also be a low-temperature oxide. Conformal layer 310 should be "conformal" in the sense that the material is deposited with equal thickness on all exposed surfaces. The term "conformal layer" denotes a layer having a thickness that does not deviate by more than 20% of an average value for the thickness of the layer. In various embodiments of the present invention, any of the well known conformal deposition methods and material can be used, for example, a low-temperature oxide may be deposited by chemical vapor deposition (CVD). Conformal layer 310 may also be deposited through atomic layer deposition method (ALD) or quasi ALD processes.

An optional dielectric material, for example, a low-k nitride material, may be deposited on top of conformal layer 310 to form sidewall spacers on sacrificial gate 122, represented by optional spacer 320. Optional spacer 320 can be formed using directional etching processes selective to conformal layer 310, but the material strength requirement is low because it does not have to withstand multiple etching processes. In various embodiments of the present invention, conformal layer 310 and optional spacer 320 may be any low-k material, such as SiCN, SiCBN, SiCOH or SiC, in addition to other known materials in the art.

Figure 4:
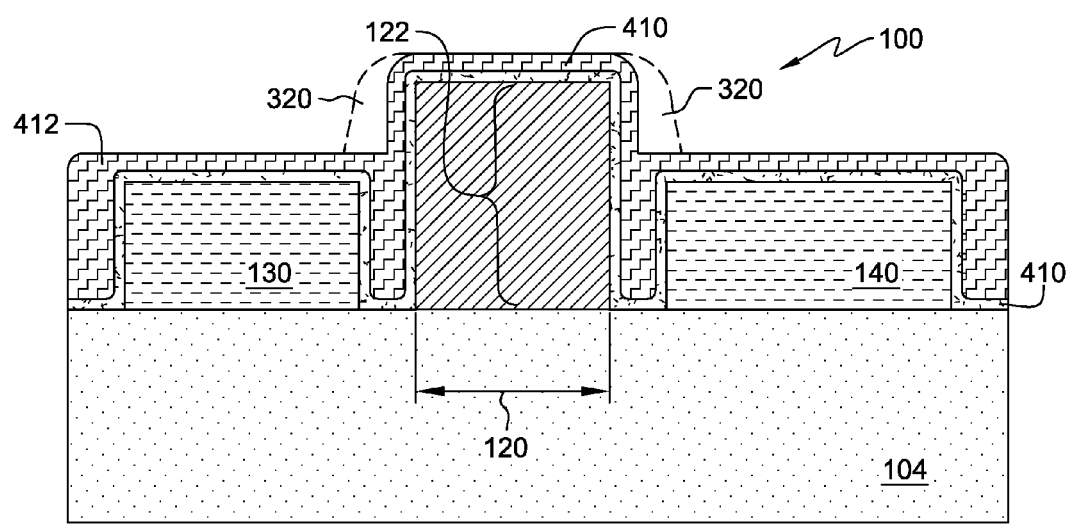
FIG. 4 depicts an alternate conformal layer deposition, in accordance with an alternate embodiment of the present invention.

FIG. 4 depicts an alternate conformal layer deposition, in accordance with an alternate embodiment of the present invention. In the alternate embodiment, conformal layer 410 is deposited first on finFET 100 and consists of a dielectric material, such as a silicon nitride material. The thickness of conformal layer 410 can be from about 1 nm to about 3 nm. Conformal, as discussed above with reference to FIG. 3, indicates a layer having a thickness that does not deviate by more than 20% of an average value for the thickness of the layer. Conformal layer 410 is deposited to cover, in a uniform layer, source region 130, drain region 140, sacrificial gate 122 and exposed areas of semiconductor fin 104 and leaves a void between source region 130 and sacrificial gate 122 and a void between drain region 140 and sacrificial gate 122. Filler layer 412 is a low-k dielectric material deposited in a conformal layer on top of conformal layer 410, in such a manner as to cover the tops of source region 130, drain region 140 and sacrificial gate 122 and to fill in any voids present on the semiconductor device, for example, the remaining void between source region 130 and sacrificial gate 122 or the remaining void between drain region 140 and sacrificial gate 122. Conformal layer 410 and filler layer 412 may be deposited using any of the well known conformal deposition methods and materials. As discussed with reference to FIG. 3, optional spacer 320 may be formed along the sidewalls of sacrificial gate 122.

Figure 5:
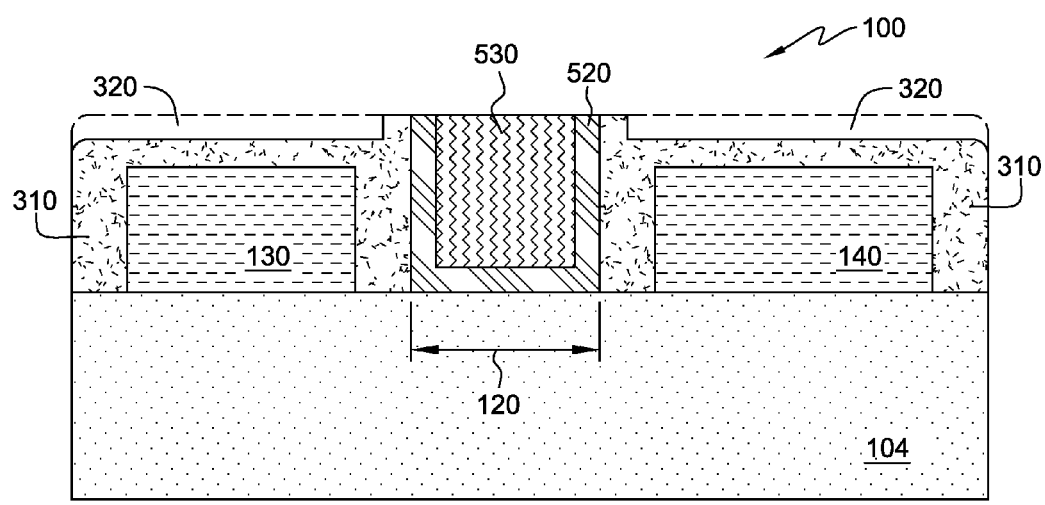
FIG. 5 depicts the semiconductor device of FIG. 1 after metal gate replacement and polishing, in accordance with an embodiment of the present invention.

FIG. 5 depicts finFET 100 after metal gate replacement and polishing, in accordance with an embodiment of the present invention. Additionally, sacrificial gate 122 has been pulled and replaced by metal gate 530 and finFET 100 has been polished, according to known methods. In an exemplary embodiment of the present invention, metal gate 530 is a tungsten material and is created applying either a physical vapor deposition operation or a chemical vapor deposition operation in the opening created by pulling sacrificial gate 122. Also shown is metal layer 520, which can include multiple metal layers, for example, a high-k metal layer, a work function metal layer and a gate metal layer. Metal gate 530 is deposited on top of metal layer 520. Conformal layer 310 remains in the void between metal layer 520 and the source/drain regions, and along the top of source region 130 and drain region 140. Optional spacer 320 can be over top of conformal layer 310.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier), or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit ships, ranging from toys and other low-end applications to advanced computer products having a display, a keyboard or other input device, and a central processor.

Having described preferred embodiments of a method for removing and replacing spacers (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method comprising:
providing a semiconductor structure, the semiconductor structure having a sacrificial gate on top of a substrate, at least a set of spacers of a first dielectric material adjacent to sidewalls of the sacrificial gate covering the substrate, and a raised source region and a raised drain region adjacent to the set of spacers;
removing the set of spacers of the first dielectric material, wherein the removing of the set of spacers of the first dielectric material is selective to the sacrificial gate and to the raised source region and the raised drain region and creates a void between the raised source region and the sacrificial gate and a void between the raised drain region and the sacrificial gate, thereby exposing the substrate directly underneath thereof;
depositing a conformal layer of a second dielectric material to the semiconductor structure, wherein the second dielectric material of the conformal layer directly covers the exposed substrate, the raised source region, the raised drain region, and the sacrificial gate, and fills at least partially bottoms of the void between the raised source region and the sacrificial gate and the void between the raised drain region and the sacrificial gate, wherein the conformal layer has a thickness between about 1 nm and about 3 nm; and
depositing a third dielectric material over the second dielectric material such that the third dielectric material completely fills in the void between the raised source region and the sacrificial gate and the void between the raised drain region and the sacrificial gate that remains after deposition of the second dielectric material, the third dielectric material being different from the second dielectric material.

2. The method of claim 1, wherein the depositing of the conformal layer of the second dielectric material comprises controlling a thickness of the conformal layer of the second dielectric material to have a variation within 20% of an average thickness throughout.

3. A method of forming a semiconductor device, the method comprising:
forming a sacrificial gate over a channel region on a semiconductor substrate;
forming one or more spacers of a first dielectric material, wherein the one or more spacers are formed adjacent to sidewalls of the sacrificial gate;
growing and forming a raised source region and a raised drain region on opposing sides of the sacrificial gate;
depositing a second dielectric material layer covering the sacrificial gate, the one or more spacers, the raised source region, the raised drain region, and the semiconductor substrate;
forming one or more additional spacers, wherein the one or more additional spacers are formed adjacent to the previously formed one or more spacers using directional etching processes on the second dielectric material layer;
subsequent to forming the one or more additional spacers, removing the one or more spacers and the one or more additional spacers using etching processes selective to the sacrificial gate, the raised source region, and the raised drain region, thereby creating a void between the raised source region and the sacrificial gate and between the raised drain region and the sacrificial gate and exposing the semiconductor substrate directly underneath thereof;
subsequent to removing the one or more spacers and the one or more additional spacers, depositing a thin conformal layer of a third dielectric material, wherein the thin conformal layer conforms to the exposed substrate, the raised source region, the raised drain region, and the sacrificial gate as a coating and leaves a second void between the raised source region and the sacrificial gate and between the raised drain region and the sacrificial gate; and
subsequent to depositing the thin conformal layer of the third dielectric material, depositing a second conformal layer of a fourth dielectric material, wherein the second conformal layer conforms to the tops of the raised source region, the raised drain region, and the sacrificial gate, and fills the second void between the raised source region and the sacrificial gate and the void between the raised drain region and the sacrificial gate.

4. The method of claim 3, further comprising:
depositing a fifth dielectric material covering the second conformal layer; and
forming sidewall spacers on the sides of the sacrificial gate, wherein the sidewall spacers are formed using directional etching processes on the fifth dielectric material and wherein the directional etching processes are selective to the fourth dielectric material.

5. The method of claim 3, wherein the etching processes performed on the second dielectric material layer include wet etch, dry etch, or some combination of both.

6. The method of claim 3, wherein the second dielectric material is a silicon nitride material.

7. The method of claim 3, wherein the third dielectric material is a low-k dielectric including at least one of: SiCN, SiCBN, SiCOH, and SiC.

8. The method of claim 3, wherein the step of depositing the thin conformal layer of the third dielectric material is performed using one of: blanket deposition, molecular layer deposition and atomic layer deposition.

9. The method of claim 3, further comprising depositing the thin conformal layer to have a thickness between about 1 nm and about 3 nm.

* * * * *